US007375040B2

(12) United States Patent
Lin et al.

(10) Patent No.: US 7,375,040 B2
(45) Date of Patent: May 20, 2008

(54) ETCH STOP LAYER

(75) Inventors: Simon S. H. Lin, Hsin-Chu (TW); Weng Chang, Taipei (TW); Syun-Ming Jang, Hsin-Chu (TW); Mong Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/325,935

(22) Filed: Jan. 5, 2006

(65) Prior Publication Data

US 2006/0110938 A1    May 25, 2006

Related U.S. Application Data

(62) Division of application No. 10/335,589, filed on Dec. 31, 2002, now abandoned.

(51) Int. Cl.
*H01L 21/205* (2006.01)
(52) U.S. Cl. .................. 438/786; 257/E21.102
(58) Field of Classification Search ............... 438/503, 438/507, 509, 786, 789; 257/E21.054, E21.102
See application file for complete search history.

(56) References Cited

U.S. PATENT DOCUMENTS

| | | | |
|---|---|---|---|
| 6,140,671 A | 10/2000 | Lee | |
| 6,468,894 B1 | 10/2002 | Yang et al. | |
| 6,492,267 B1 | 12/2002 | Yin et al. | |
| 6,541,397 B1 * | 4/2003 | Bencher | 438/780 |
| 6,548,892 B1 | 4/2003 | Steiner et al. | |
| 6,627,532 B1 * | 9/2003 | Gaillard et al. | 438/623 |
| 6,759,327 B2 * | 7/2004 | Xia et al. | 438/643 |
| 6,764,958 B1 | 7/2004 | Nemani et al. | |
| 2001/0053591 A1 | 12/2001 | Buchwalter et al. | |
| 2002/0013060 A1 * | 1/2002 | Shioya et al. | 438/699 |
| 2002/0142579 A1 * | 10/2002 | Vincent et al. | 438/623 |
| 2003/0087043 A1 * | 5/2003 | Edelstein et al. | 427/569 |
| 2003/0119307 A1 | 6/2003 | Bekiaris et al. | |
| 2003/0129827 A1 * | 7/2003 | Lee et al. | 438/629 |
| 2003/0176058 A1 | 9/2003 | Weldman et al. | |
| 2003/0181034 A1 | 9/2003 | Jiang et al. | |
| 2004/0097099 A1 | 5/2004 | Li et al. | |

FOREIGN PATENT DOCUMENTS

TW        492138       6/2002

* cited by examiner

*Primary Examiner*—Carl Whitehead, Jr.
*Assistant Examiner*—Jennifer M. Dolan
(74) *Attorney, Agent, or Firm*—Slater & Matsil, L.L.P.

(57) ABSTRACT

A SiOC layer and/or a SiC layer of an etch stop layer may be improved by altering the process used to form them. In a bi-layer structure, a SiOC layer and/or a SiC layer may be improved to provide better reliability. A silicon carbide (SiC) layer may be used to form a single-layer etch stop layer, while also acting as a glue layer to improve interface adhesion. Preferably, the SiC layer is formed in a reaction chamber having a flow of substantially pure trimetholsilane (3MS) streamed into and through the reaction chamber under a pressure of less than about 2 torr therein. Preferably, the reaction chamber is energized with high frequency RF power of about 100 watts or more. Preferably, the SiOC layer is formed in a reaction chamber having a flow of 3MS and $CO_2$, and is energized with low frequency RF power of about 100 watts or more.

13 Claims, 6 Drawing Sheets

ETCH STOP LAYER

This application is a divisional of patent application Ser. No. 10/335,589, entitled "Etch Stop Layer," filed on Dec. 31, 2002, now abandoned which application is incorporated herein by reference.

TECHNICAL FIELD

The present invention relates generally to semiconductor devices and methods for manufacturing semiconductor devices. In one aspect, the present invention relates to improved methods of forming etch stop layers.

BACKGROUND

A nitrogen-free etch stop layer is currently preferred for copper dual damascene structures having a low-k dielectric intermetal layer to avoid problems caused by outgassing from the low-k dielectric (e.g., via poisoning, resist scumming, via blinding). Currently a bi-layer structure is often used for providing a nitrogen-free etch stop layer for 90 nm and above technologies, for example. A SiOC layer is currently used as a nitrogen-free etch stop for the dual damascene process. SiOC is currently adopted for its low-k dielectric properties and inter-metal dielectric etch selectivity. A bottom SiC layer is currently used as a glue layer to improve the adhesion between the underlying layer and the etch stop layer. When part of the underlying layer includes copper (e.g., for metal interconnects and/or contacts), the SiC layer also prevents the SiOC from oxidizing the copper. However, a bi-layer structure often causes additional interface adhesion concerns, due in part to the current quality of the SiOC and SiC layers. Also, the use of and processing of the SiOC as the etch stop layer introduces the problem of oxidizing copper in the underlying layer. Thus, it would be desirable to be able to eliminate the bi-layer structure for nitrogen-free etch stop layers, as well as limiting or eliminating the use of SiOC as an etch stop layer material in some cases (e.g., 65 nm technology).

SUMMARY OF THE INVENTION

The problems and needs outlined above are addressed by embodiments of the present invention. In accordance with one aspect of the present invention, a method of manufacturing a semiconductor device is provided. This method includes the following steps (the order of which may vary). A layer of silicon carbide (SiC) is formed directly on an underlying layer. A dielectric layer is formed directly on the SiC layer. The dielectric layer having a top surface. The dielectric layer is etched to form an opening therein with a first etch chemistry, and the SiC layer acts as an etch stop layer. A conducting material is deposited into the opening and on the top surface of the dielectric. A portion of the conducting material is removed so that a top surface of the conducting material is substantially planar with the top surface of the dielectric layer. The SiC layer may be etched at the opening with a second etch chemistry. The first etch chemistry is preferably selective against etching SiC. The SiC layer preferably has a thickness between about 20 angstroms and about 550 angstroms. The forming of the SiC layer is preferably performed by flowing substantially pure trimetholsilane (3MS) into a reaction chamber having a pressure of less than about 2 torr therein.

In accordance with another aspect of the present invention, a semiconductor device is provided. This semiconductor device has a first silicon carbide (SiC) layer formed directly on an underlying layer. It also has a first dielectric layer formed directly on the SiC layer. The first dielectric layer has a top surface. A first conductor extends through the first dielectric layer and the first SiC layer. The first conductor has a top surface. The top surface of the first conductor is substantially planar with the top surface of the dielectric layer. The SiC layer preferably acts as a glue layer and as an etch stop layer.

In accordance with yet another aspect of the present invention, a semiconductor device is provided. This semiconductor device has a plurality of transistors, each of the transistors having a channel length of 130 nm or less. An oxide layer overlies the plurality of transistors. A silicon carbide (SiC) layer is formed directly on the oxide layer. The dielectric layer is formed directly on the SiC layer. The dielectric layer has a top surface. A conducting material is disposed within a trench formed in the dielectric layer. The conducting material has a top surface. The top surface of the conducting material is substantially planar with the top surface of the dielectric layer. A contact extends through the dielectric layer and the SiC layer to connect one of the transistors to the conducting material. The transistors may be CMOS transistors.

In accordance with still another aspect of the present invention, a method of manufacturing a semiconductor device is provided. This method includes the following steps (the order of which may vary). A silicon carbide (SiC) etch stop layer is formed on an underlying layer in a reaction chamber with a process that includes the following parameters (these may be done simultaneous or in a varied order): a) substantially pure trimetholsilane (3MS) is flowed into and through the reaction chamber, and b) the reaction chamber is pressurized at a pressure less than about 2 torr. Then, a dielectric layer is formed over the SiC layer.

In accordance with another aspect of the present invention, a semiconductor device is provided. This semiconductor device has a layer of silicon carbide (SiC) material formed on an underlying layer. The material properties of the SiC material are such that the SiC material has a current leakage of less than about $1.0 \times 10^{-6}$ amps per square centimeter at an electric field of about 2 megavolts per centimeter. A dielectric layer is formed over the SiC layer. A conductor (e.g., conducting line, contact, or both) extends through the dielectric layer and the SiC layer. The current leakage is preferably about $1.5 \times 10^{-8}$ amps per square centimeter at about 2 megavolts per centimeter, and preferably about $1.0 \times 10^{-9}$ amps per square centimeter at about 1 megavolts per centimeter.

In accordance with still another aspect of the present invention, a method of manufacturing a semiconductor device is provided. This method includes the following steps (the order of which may vary). A SiOC etch stop layer is formed over an underlying layer (e.g., a SiC layer in a bi-layer etch stop layer structure) in a reaction chamber with a non-He process that includes the following parameters (these may be done simultaneously or in a varied order): a) flowing trimetholsilane (3MS) into and through the reaction chamber; b) flowing $CO_2$ into and through the reaction chamber; c) pressurizing the reaction chamber at a pressure less than about 2 torr; and d) energizing the reaction chamber with low frequency RF power of at least about 100 watts. A dielectric layer is then formed over the SiOC layer. The underlying layer may be a SiC layer or some other layer. The flow rate of the 3MS flowing is preferably about 100 sccm. The flow rate of the $CO_2$ flowing is preferably about 350 sccm. The process parameters for forming the SiOC layer may further include heating the reaction chamber to a temperature of about 350° C. and energizing the reaction chamber with high frequency RF power of at about 400 watts.

In accordance with yet another aspect of the present invention, a semiconductor device is provided, which includes a layer of silicon carbide (SiC) material, a layer of SiOC material, a dielectric layer, and a conductor. The SiC layer is formed on an underlying layer. The SiOC layer is formed on the SiC layer. The SiOC layer is capable of passing an electron migration test having conditions of about 300° C. with a J stress of about $2 \times 10^6$ A/cm2. Also, the SiOC layer is capable of passing a stress migration test having conditions of about 175° C. for about 500 hours. The dielectric layer is formed on the SiOC layer. The conductor extends through the dielectric layer, the SiOC layer, and the SiC layer. Also, the SiC material preferably has a current leakage of less than about $1.0 \times 10^{-6}$ amps per square centimeter at an electric field of about 2 megavolts per centimeter.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A and 1B provide simplified cross-section views of a bi-layer nitrogen-free etch stop layer of the prior art;

FIGS. 2A-5 provide simplified cross-section views of a single layer nitrogen-free etch stop layer comprising SiC in accordance with a first embodiment of the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed herein are merely illustrative of some of the specific ways to make and use the invention, and do not limit the scope of the invention.

The present invention will be described herein with respect to preferred embodiments in a specific context of semiconductor devices having CMOS technology. The invention may also be applied, however, to other situations.

Figures 1A, 1B, 2A, 2B, 3, 4:
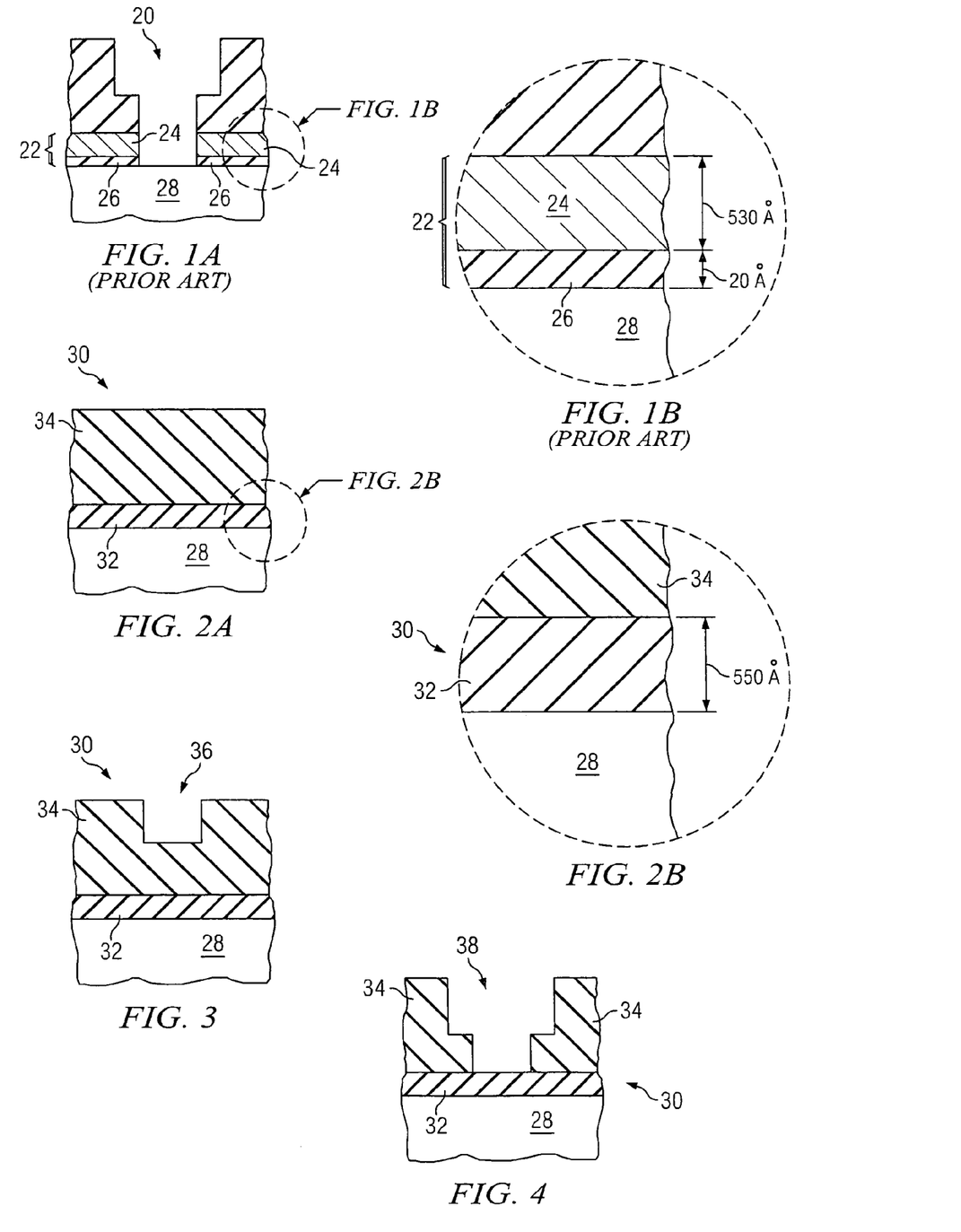

FIGS. 1A and 1B show a contact opening 20 formed with a dual damascene process while using a conventional bi-layer structure 22 for the etch stop layer. As shown in FIG. 1B, a current nitrogen-free etch stop layer 22 may have a bulk layer of SiOC 24 formed directly on a thin layer of SiC 26, which is directly formed on the underlying layer 28. The SiOC layer 24 is typically about 530 angstroms thick and the SiC layer 26 is typically about 20 angstroms thick (see FIG. 1B), for example.

A nitrogen-free etch stop layer is currently preferred for copper dual damascene structures having a low-k dielectric intermetal layer to avoid problems caused by outgassing from the low-k dielectric (e.g., via poisoning, resist scumming, via blinding). A SiOC layer 24 in a bi-layer structure 22 is currently used as a nitrogen-free etch stop for the dual damascene process. A SiC layer 26 in a bi-layer structure 22 is sometimes used as a glue layer to improve the adhesion between the underlying layer 28 and the etch stop layer 24. When part of the underlying layer 28 includes copper (e.g., for metal interconnects and/or contacts), the SiC layer 26 also prevents the SiOC layer 24 from oxidizing the copper (i.e., due to the oxygen contained in the SiOC formation process).

In a prior bi-layer structure 22 of SiOC 24 and SiC 26, as shown in FIG. 1B, the SiC layer 26 is typically lower quality (relative to pure SiC) due to the chemistries used in forming the bi-layer structure 22, which typically consists of a combination of trimetholsilane ($SiH(CH_3)_3$) ("3MS" hereinafter), carbon dioxide ($CO_2$), and helium (He) (or 3MS/$CO_2$/He). Such lower quality SiC has poor electrical properties due to more leakage during time dependent dielectric breakdown (TDDB) tests than the SiOC material used for the etch stop layer 22. However, as described below, the inventors have developed a process for making a higher quality SiC layer (i.e., more pure SiC) with leakage during TDDB tests improved by as much as three orders of magnitude. With this improvement in the resulting SiC layer (due to the developed process), the improved SiC layer can have electrical properties competitive with that of the SiOC material used in the bi-layer etch stop layer structure 22.

FIGS. 2A and 2B show an initial structure of a first embodiment 30 of the present invention. In FIG. 2A, a SiC layer 32 is formed directly on an underlying layer 28, and a dielectric layer 34 is formed directly on the SiC layer 32. As shown in FIG. 2B, the bi-layer structure 22 of FIG. 1B may be replaced with a single layer of SiC 32 having a thickness of about 550 angstrom, for example. Hence, the SiC layer 32 acts as both a glue layer for ensuring adhesion between the dielectric layer 34 and the underlying layer 28, and as an etch stop layer used during the formation of a contact opening. Using a single layer of SiC, in accordance with the present invention, may be useful for 65 nm technologies and smaller, for example.

The dielectric layer 34 is preferably a material having a low dielectric constant (low-k dielectrics) to lower parasitic capacitance and cross-talk between metal lines. The dielectric layer 34 may be composed of any of a variety of dielectric materials, including but not necessarily limited to: silicon dioxide; a diamond-structured carbon (e.g., Black Diamond™ available from Applied Materials);SILK™ available from Dow Chemical; FLARE™ available from Honeywell; LKD (low k dielectric) from JSR Micro; hydrogenated oxidized silicon carbon material (SiOCH) or compounds thereof; amorphous hydrogenated silicon (a-Si:H); silicon-oxygen-nitrogen compounds ($SiO_xN_y$); low-k polymers; organic polymers (e.g., polyimide, parylene, polyarylether, organo-silicone, polynaphthalene, polyquinoline, or copolymers thereof); or combinations thereof, for example. In general, a low-k dielectric can be any dielectric with a dielectric constant lower than that of silicon dioxide.

The underlying layer 28 may be: another metal layer (e.g., dielectric with conducting material or metal contacts and/or lines formed therein); a substrate having highly doped regions (source, drain); an oxide layer having contacts extending therethrough; and/or a substrate layer having electrical components formed therein (e.g., transistors, capacitors, resistors, diodes, etc.), for example.

Figure 5:
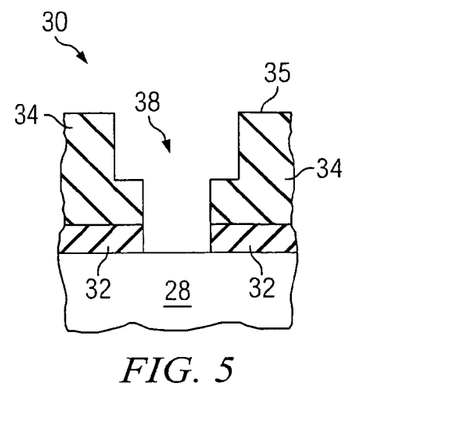

FIGS. 3-5 illustrate the use of the first embodiment 30 in a dual damascene process for forming an opening. In FIG. 3, the dielectric layer 34 has been anisotropically etched using a first photoresist mask (not shown) to form an initial opening 36 in the dielectric layer 34. In FIG. 4, the dielectric layer 34 has been anisotropically etched using a second photoresist mask (not shown) to form the remainder of the contact opening 38. The etches performed to achieve the openings 36 and 38 shown in FIGS. 3 and 4 may be performed using an etch chemistry that is selective against etching SiC, such as a $C_5F_8$ etch chemistry. Hence, the SiC layer 32 acts as an etch stop layer. In FIG. 5, the SiC layer 32 is etched away at the contact opening 38 using another etch chemistry with a good etch selectivity between SiC and low-k dielectric.

Figure 6:
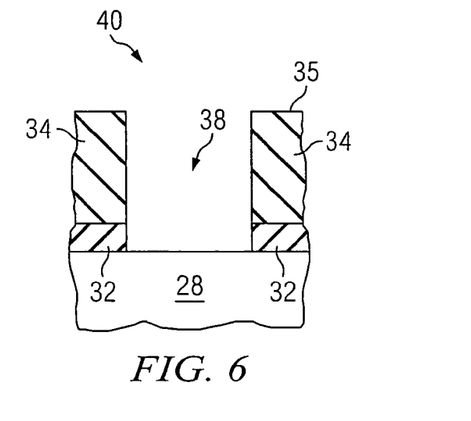
FIG. 6 provides a simplified cross-section view of a second embodiment of the present invention.

In a second embodiment 40, the SiC layer 32 may be used as an etch stop layer for a single damascene procedure as well, as shown in FIG. 6. In a single damascene process, the opening 38 sometimes will not extend all the way through the etch stop layer 32 to the underlying layer 28, such as when the opening 38 is a trench for a conducting line.

Although not shown in FIGS. 5 and 6, the damascene process (single or dual), is completed by filling the opening 38 with a conductor, such as copper for example. A copper layer (not shown) typically would be deposited over the device and polished (e.g., chemical-mechanical polishing) back to fill the opening 38. The result is that a top surface of the conducting material will be substantially planar with a top surface 35 of the dielectric layer 34. A specific example of this process is shown in greater detail in FIGS. 15-17 (discussed below).

The process of the present invention used to form the higher quality SiC layer 32 that may be used as the etch stop layer while also performing the duty of improving interface adhesion, will be next described. In a preferred process of the present invention, the SiC layer 32 is deposited using a flow of substantially pure 3MS with a flow rate of about 150 sccm, at a temperature of about 350° C., into a reaction chamber (not shown) under a pressure of less than about 2 torr, and submitted to high frequency radio frequency (HFRF) power of about 100 W or more (in AMAT's Producer SE system, for example). The 3MS plasma environment created under these conditions in the reaction chamber induces the formation of the SiC layer 32 on the underlying layer 28. In testing, it has been found that a pressure of about 1.7 torr works well for this process, for example. During the preferred process, the SiC layer 32 is preferably built up to about 550 angstroms, for example, to form a single etch stop layer of SiC, as shown in FIGS. 2A and 2B. However, the SiC layer 32 may also be built up to another thickness, as needed for a given application. For semiconductor production, the SiC layer 32 may be built up between about 20 angstroms (e.g., in a bi-layer structure as the bottom glue layer) and about 600 angstroms (e.g., a single SiC etch stop layer), for example.

Figure 7:
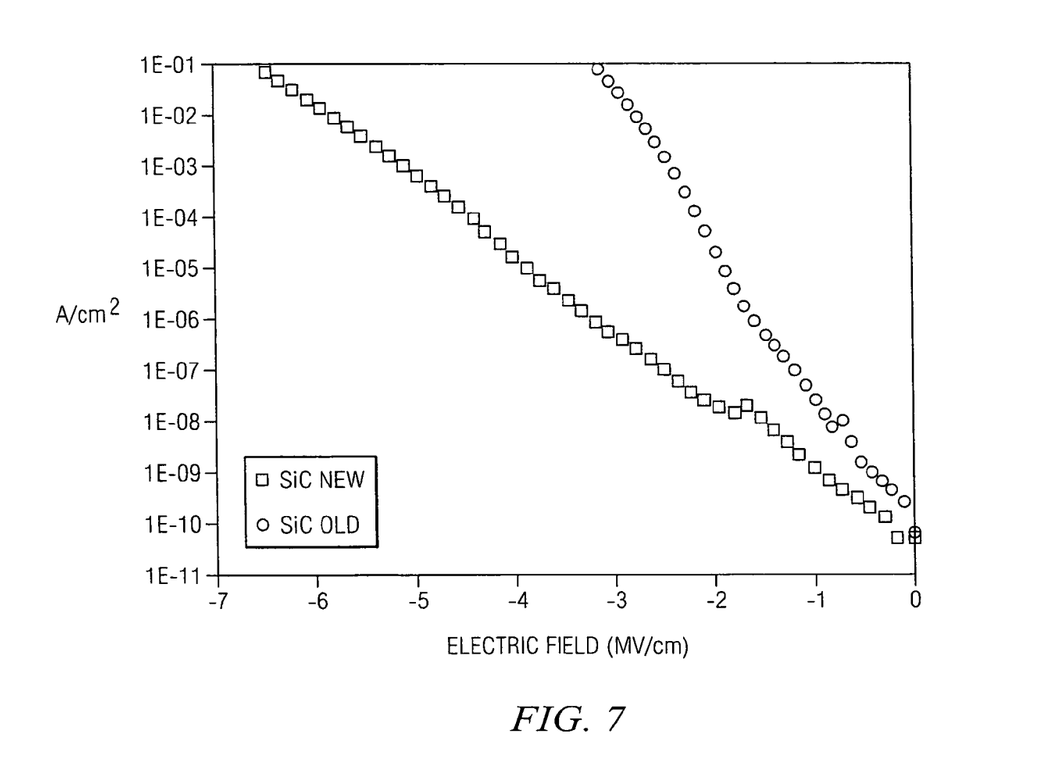
FIG. 7 provides a plot comparing a SiC layer formed using the new process with a SiC layer formed using an old process.

In contrast, prior used processing methods for forming a bi-layer structure 22 (see e.g., FIG. 1B) used 3MS combined with $CO_2$ and He, which produced the lower quality SiC that is less desirable. The resulting SiC etch stop layer 32 from a preferred process of the present invention has been shown in testing to have an inter-metal dielectric (IMD) TDDB leakage performance improvement (over the prior low quality SiC layer 26 used in the bi-layer structures 22) of about three orders of magnitude when tested at about 2 MV/cm and about 1.5 orders of magnitude performance improvement when tested at about 1 MV/cm. Also, the break down voltage ($V_{bd}$) at about 1 mA/cm$^2$ is improved by about three orders of magnitude. A plot from one of such tests is shown in FIG. 7, which shows leakage current (in amps per square centimeter) versus electric field (in megavolts per centimeter). In the test used to generate the plot of FIG. 7, a 500 angstroms thick layer of SiC was formed using each process (old and new) on a substrate of high-conductivity silicon. The plot in FIG. 7 shows the old SiC layer (i.e., formed using a 3MS/$CO_2$/He process as for the bi-layer structure 22) compared with the improved SiC layer (i.e., formed using a process of the present invention; in this case, pure 3MS at about 1.7 torr). Note on the plot in FIG. 7 that the current leakage at about 2 megavolts per centimeter is about 1.5× $10^{-8}$ amps per square centimeter for the improved SiC layer formed in accordance with a preferred embodiment, and the current leakage at about 1 megavolts per centimeter is about $1.0 \times 10^{-9}$ amps per square centimeter.

Figure 8:
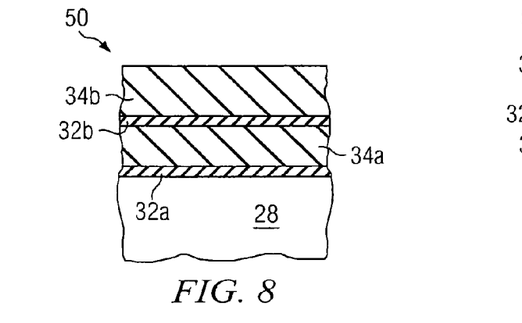
FIGS. 8-12 provide simplified cross-section views of a third embodiment of the present invention.
Figures 9, 18:
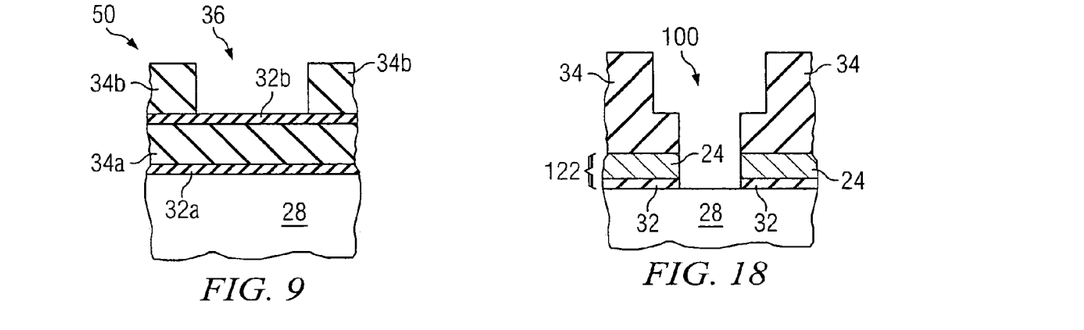
FIG. 18 provides a simplified cross-section view of a fifth embodiment of the present invention.
Figures 10, 19:
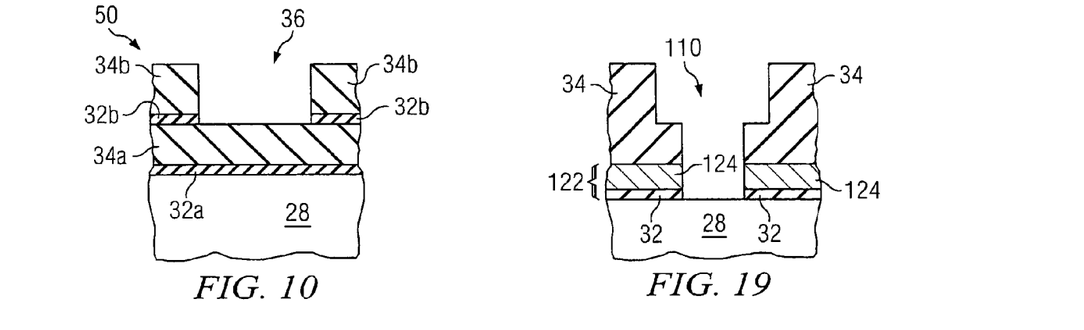
FIG. 19 provides a simplified cross-section view of a sixth embodiment of the present invention.
Figures 11, 20:
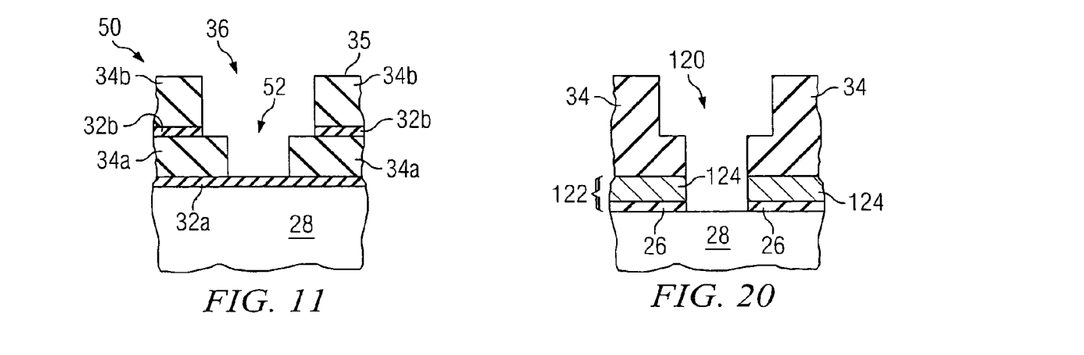
FIG. 20 provides a simplified cross-section view of a seventh embodiment of the invention.
Figure 12:
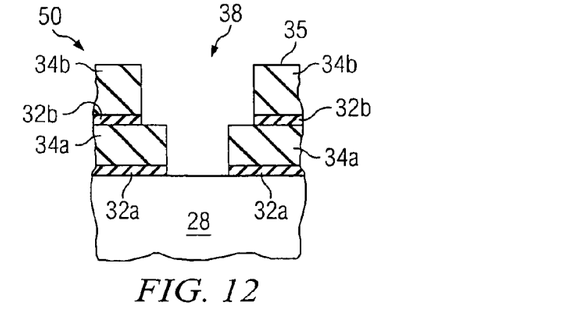

FIGS. 8-12 show a third embodiment 50 of the present invention to illustrate the use of the present invention during another dual damascene procedure for forming a contact opening 38. In FIG. 8, a first SiC etch stop layer 32a is formed directly on an underlying layer 28. A first low-k dielectric layer 34a (e.g., diamond-like carbon) is formed directly on the first SiC etch stop layer 32a. A second SiC etch stop layer 32b is formed directly on the first low-k dielectric layer 34a. A second low-k dielectric layer 34b (e.g., diamond-like carbon) is formed directly on the second SiC etch stop layer 32a. A first opening 36 is etched in the second low-k dielectric layer 34b with an etch chemistry selective against etching SiC (e.g., $C_5F_8$), as shown in FIG. 9. Then, as shown in FIG. 10, the second SiC etch stop layer 32b is etched away at the first opening 36 using another etch chemistry that will etch SiC. Next, a second opening 52 is etched in the first low-k dielectric layer 34a with an etch chemistry selective against etching SiC (e.g., $C_5F_8$), as shown in FIG. 11. Then, as shown in FIG. 12, the first SiC etch stop layer 32a is etched away at the second opening 52 using another etch chemistry that will etch SiC to complete the contact opening 38.

In other embodiments (not shown), the first etch stop layer 32a or the second etch stop layer 32b may incorporate a material other than SiC. For example, the SiC material may be more needed for use between the underlying layer 28 and the first dielectric layer 34a (depending on the materials present in the underlying layer 28 and depending on the first dielectric layer material) for purposes of better adhesion among these layers, than for the second etch stop layer between the first and second dielectric layers.

FIGS. 13-17 show a fourth embodiment 60 of the present invention, which is a more specific embodiment to illustrate use of the present invention in the production of a semiconductor device. In particular, FIGS. 13-17 show that the fourth embodiment 60 may be used with a CMOS process that incorporates dual damascene copper metalization with low-k inter-metal insulation, which is a diamond-like carbon material in this example. This embodiment describes just one example, and many other processes for forming other semiconductor devices may also use the present invention.

Figure 13:
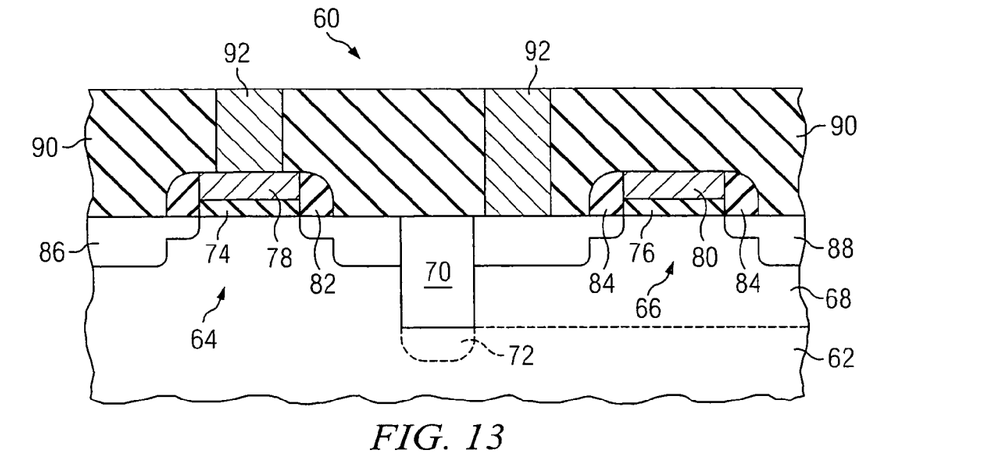
FIGS. 13-17 provide cross-section views of a fourth embodiment of the present embodiment, as a more specific embodiment.

Referring first to FIG. 13, a semiconductor region 62 is provided, which may include a lightly doped monocrystalline silicon layer. For example, the semiconductor region 62 may include a silicon substrate or a layer upon (e.g., an epitaxial layer or a SOI (silicon-on-insulator) layer) or within (e.g., a well, such as a triple well structure) a silicon substrate.

Because a CMOS process is being described, two transistors are illustrated. An n-channel MOS transistor 64 is formed in the semiconductor region 62 while a p-channel MOS transistor 66 is formed in an n-well 68. This configuration assumes that the semiconductor region 62 is a lightly doped p-region. If an n-type region is used for the semiconductor region 62, then the n-channel- transistor 64 will be formed in the well 68. It is also possible that both transistors 64 and 66 are formed in well regions.

Aspects of the present invention are useful in small sized semiconductor technologies. For example, an integrated circuit that includes transistors 64 and 66 can be formed using 0.13 µm or 90 nm technology or even smaller (e.g., sub-65 nm technology). In these cases, the transistor channel lengths (of most if not all of the transistors) will be about 0.13 µm for the n-channel MOS transistors 64 and about 90 nm or less for the p-channel MOS transistors 66. It is expected that embodiments of the present invention will also be useful at smaller dimensions, e.g., for a physical gate length of 45 nm or less.

The n-channel transistor 64 is isolated from the p-channel transistor 66 by a shallow trench isolation (STI) region 70. The STI region 70 is formed from a trench about 2500 to about 4000 µm deep in a 6000 µm layer. The trench is filled with an insulator, such as silicon dioxide, for example. Optionally, a more heavily doped semiconductor region 72 may be formed below the STI region 70 to provide further isolation. Alternatively, other isolation, such as field isolation, may be used.

The form transistor 64 (66), a gate dielectric layer 74/76 and a gate layer 78/80 are formed. As shown in the fourth embodiment, a single gate dielectric layer and a single gate layer are preferably used for both transistors 64 and 66. Either of these layers may be a compound layer. For example, the gate layer 78/80 may include a polysilicon layer and a silicide layer.

The gate layer 78/80 may be etched to form gates 78 and 80. A lightly doped implant is then formed for each transistor region. Resist may be used to protect the region that is not being doped. Sidewall spacers 82 and 84 are then formed over both gates followed by more heavily doped implants for each transistor. These implants preferably use arsenic and/or phosphorus for the n-channel device and boron for the p-channel device to form the source/drain regions 86 and 88 of the transistors 64 and 66, respectively. Again, resist may be used to protect the region that is not being doped.

An insulating layer 90 is formed over the device. This insulating layer 90 typically comprises an oxide, such as silicon dioxide, or a doped glass, such as phosphosilicate glass (PSG) or borophosphosilicate glass (BPSG). Vias are formed in the insulating layer 90 and filled with conductive material to form contacts (or plugs) 92. As an example, the conductive material may be tungsten. The two contacts 92 are illustrated as being connected to two arbitrarily chosen regions. It is understood that more (or fewer) contacts could be used and could contact whichever regions the particular design requires.

Figure 14:
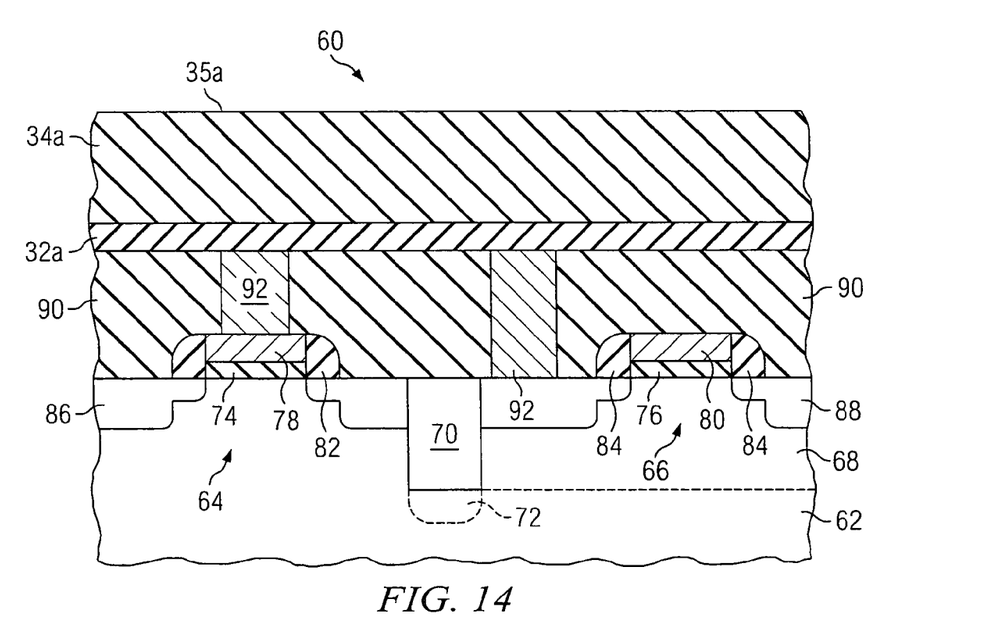

Referring now to FIG. 14, a SiC etch stop layer 32a is formed over the insulating layer 90 and contacts 92. The SiC etch stop layer 32a may be deposited to a thickness of between about 10 nm (100 angstrom) and about 60 nm (600 angstroms), and preferably about 55 nm (550 angstroms), for example.

A low-k dielectric layer 34a (e.g., diamond-structured carbon, such as Black Diamond™) is deposited over the SiC etch stop layer 32a. The low-k dielectric layer 34a may be deposited to a thickness of between about 200 nm and about 800 nm, preferably about 500 nm, for example.

Figure 15:
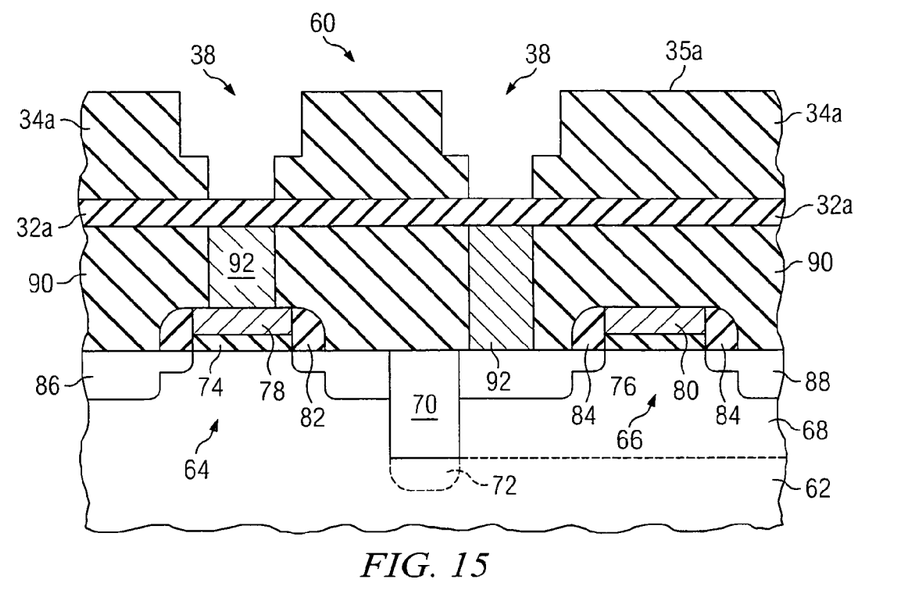

Referring now to FIG. 15, a contact opening is formed in the dielectric layer 34a using a dual damascene process etching down to the etch stop layer 32a using a first etch chemistry that is selective against etching SiC. The etch stop layer 32a at the contact opening is then etched away using a second etch chemistry that will etch the SiC.

Figure 16:
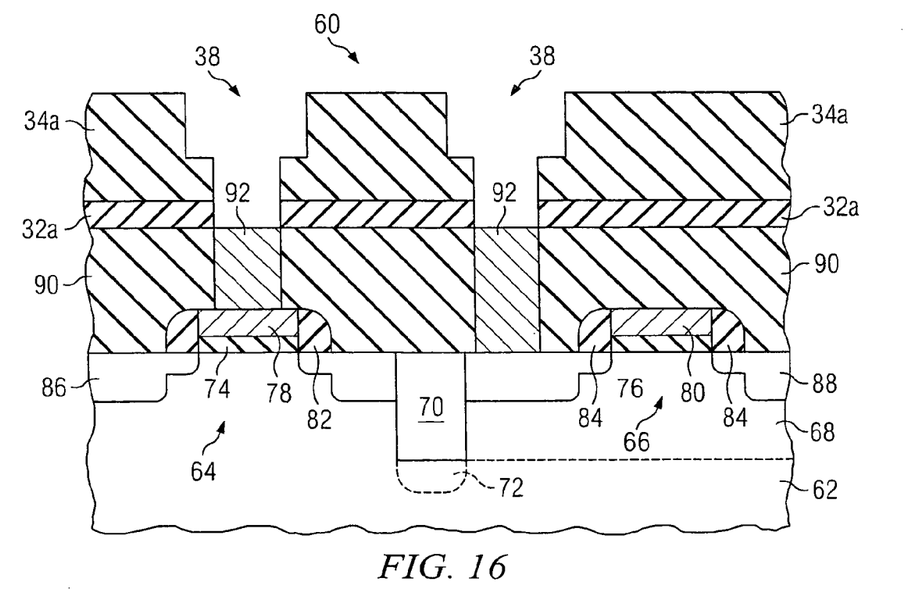

Referring now to FIG. 16, a dual damascene interconnect structure is shown in FIG. 16. The illustration of this structure includes two contacts and lines 94a, although it is understood that other configurations can be used. While a dual damascene process is illustrated, it should be understood that other processes such as single damascene or contact via formation techniques (as shown for contacts 92) may be used.

Figure 17:
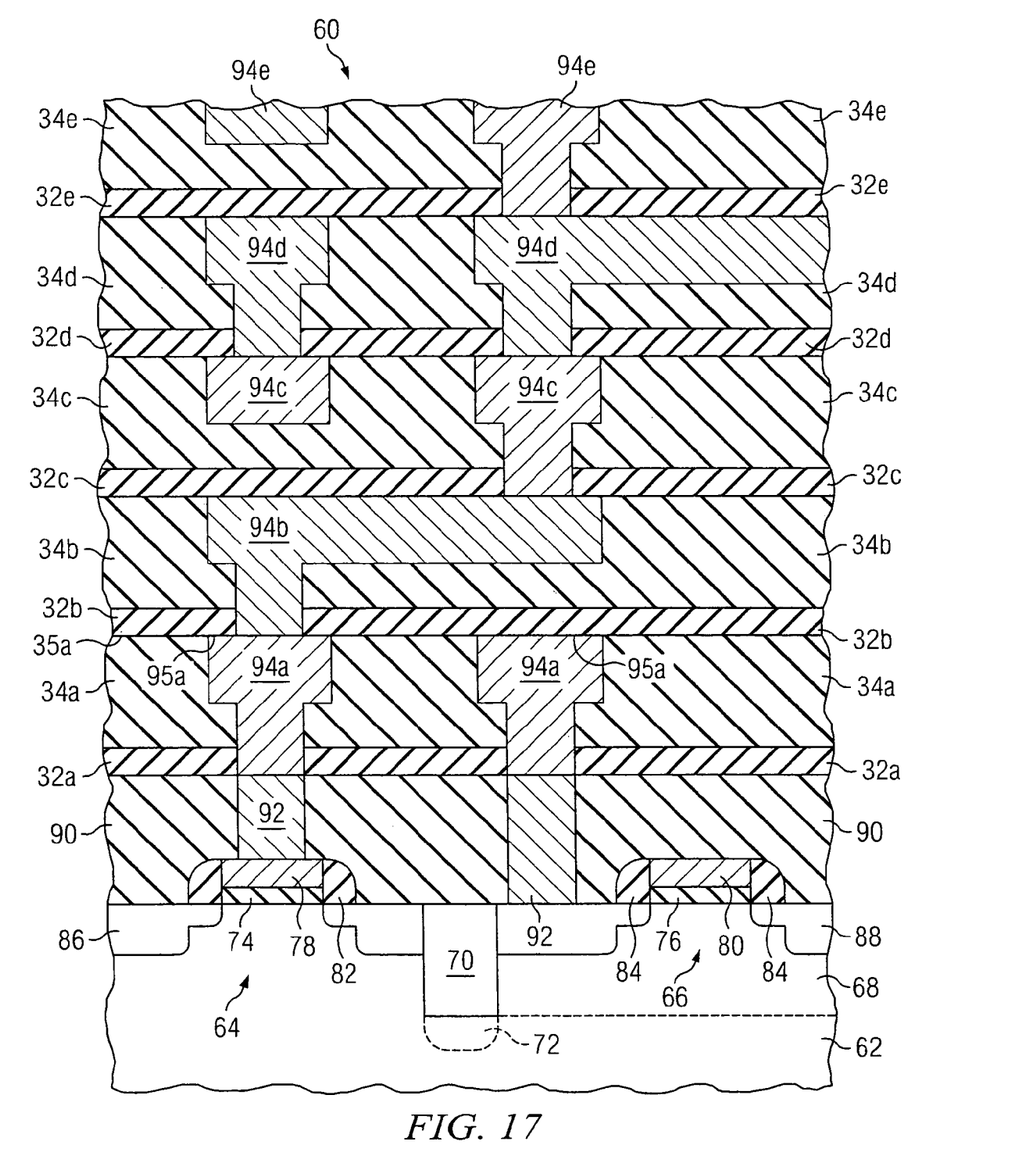

In the dual damascene process, trenches are formed within the dielectric layer 34a and contact holes are formed within the trenches to contact selected portions beneath the dielectric layer 34a. The trenches and contact vias can then be filled with a conducting material, preferably copper. Typically, the conducting material (e.g., 94a) is deposited into the openings 38 and onto a top surface (e.g., 35a) of the dielectric layer (e.g., 34a). Then, the conducting material 94a is polished back so that a top surface 95a of the conducting material 94a is substantially planar with the top surface 35a of the dielectric layer 34a, as shown in FIG. 17 for example. Further details on dual damascene processes that include low-k dielectric layers can be found in the following patents, each of which is incorporated herein by reference: U.S. Pat. No. 6,342,448 entitled "Method of fabricating barrier adhesion to low-k dielectric layers in a copper damascene process;" U.S. Pat. No. 6,319,809 entitled "Method to reduce via poison in low-k Cu dual damascene by UV-treatment;" and U.S. Pat. No. 6,211,061 entitled "Dual damascene process for carbon-based low-K materials."

As illustrated in FIG. 17, more than one layer of metalization may be included. In this device five levels of metal 94a, 94b, 94c, 94d, and 94e are shown. While the illustrated embodiment shows five layers, it is understood that a semiconductor device of the preferred embodiment could include more (or fewer) than five layers of metalization. For example, a chip might include up to eight layers or more in 0.13 µm technology. Each of these layers may be processed using the steps described herein. In other embodiments (not shown), SiC may be used for only some of the etch stop layers 32a, 32b, 32c, 32d, and 32e, depending on the needs of the design and the materials used.

FIG. 18 shows a fifth embodiment 100 of the present invention to illustrate the use of an improved SiC layer in accordance with the present invention within a bi-layer etch stop layer structure 122. In the fifth embodiment 100, the SiC layer 32 is formed using a preferred process of the present invention (e.g., pure 3MS at about 1.7 torr, as described above in relation to FIG. 7). In the fifth embodiment 100, the SiOC layer 24 is formed using prior methods.

FIG. 19 shows a sixth embodiment 110 of the present invention to illustrate the use of an improved SiOC layer 124 and an improved SiC layer 32 in accordance with the present invention within a bi-layer etch stop layer structure 122. As in the fifth embodiment 100, the SiC layer 32 of the six embodiment 110 is formed using a preferred process of the present invention (e.g., pure 3MS at about 1.7 torr, as described above in relation to FIG. 7).

In the past, the SiOC layer was often formed using a process that included helium. The improved SiOC layer 124 in the sixth embodiment 110 is formed using a preferred process for forming the SiOC layer 124 of the present invention. In this preferred process, the SiOC layer 124 is deposited using a flow of substantially pure 3MS with a flow rate of about 100 sccm and a flow of $CO_2$ with a flow rate of about 350 sccm, into a reaction chamber (not shown), at a temperature of about 350° C., under a pressure of less than about 2 torr, and submitted to high frequency radio frequency (HFRF) power of about 400 W and a low frequency radio frequency (LFRF) of about 100 W or more (in AMAT's Producer SE system, for example). The 3MS/$CO_2$ plasma environment created under these conditions in the reaction chamber induces the formation of the improved SiOC layer 124 on the SiC layer 32. This preferred process provides a non-helium (non-He) method of forming an improved SiOC layer 124. In testing, it has been found that a pressure of about 1.7 torr works well for this process, for example. One of the keys to this preferred process of forming an improved SiOC layer 124 is the use of 100 W or more LFRF power. In one use of the preferred process, it has been found that a LFRF of about 200 W works well.

For example, as compared to prior processes for forming a SiOC layer using a pressure of greater than 2 torr, using a flow of He in combination with a 3MS and $CO_2$ flow, and/or not using LFRF, the improved SiOC layer formed using the preferred process of the present invention provides improved electron migration (EM) and stress migration (SM) test results. An improved SiOC layer formed using a preferred process (non-He process) of the present invention has passed EM tests having conditions of about 300° C. with a J stress of about $2\times10^6$ A/cm$^2$ and has passed SM tests having conditions of about 175° C. for about 500 hours to see RC shift (with a RC via size of about 0.13 µm). The lower pressure (i.e., less than about 2 torr) also improves film quality in the SiOC layer 124 and the SiC layer 32.

FIG. 20 shows a seventh embodiment 120 of the present invention to illustrate the use of an improved SiOC layer 124 in accordance with the present invention within a bi-layer etch stop layer structure 122. In the seventh embodiment 120, the SiOC layer 124 is formed using a preferred process of the present invention (e.g., a flow of 3MS/$CO_2$ at less than about 2 torr with a LFRF of about 100 W or more, as described above in relation to the sixth embodiment 110). In the seventh embodiment 120, the SiC layer 26 is formed using prior methods.

Some of the advantages that may be achieved using a process of the present invention and using an embodiment of the present invention are listed below. Various embodiments of the present invention may include some or all of these advantages, and other advantages not listed may also exist:

1. Improving electrical properties for the SiC layer with respect to TDDB tests;

2. Ability to have a single-layer nitrogen-free etch stop layer that performs at least as well as a nitrogen-free etch stop layer having a bi-layer structure of SiOC and SiC;

3. Ability to have a simpler process with less steps for forming an etch stop layer (for single SiC layer etch stop layer), as compared to bi-layer structure;

4. Ability to have dual functions of the SiC layer acting as an etch stop layer and as a glue layer 5. Improving interface adhesion (for single SiC layer etch stop layer), as compared to bi-layer structure;

6. Ability to provide a low-dielectric-constant etch stop layer to improve RC delay;

7. Providing less or no concern of the etch stop layer oxidizing copper that may be present in the underlying layer (such oxidation would likely cause worse RC delay) (for single SiC layer etch stop layer);

8. Providing higher etch selectivity of SiC with respect to the dielectric layer (e.g., Black Diamond® material) (for single SiC layer etch stop layer as compared to SiOC) due to a higher carbon difference;

9. Providing better etch selectivity than a SiOC etch stop layer with respect to low-k SiOC (for single SiC layer etch stop layer), which is sometimes used as the dielectric layer;

10. Avoiding an additional layer interface to eliminate possible additional adhesion concerns (for single SiC layer etch stop layer as compared to bi-layer structure);

11. Outstanding moisture resistance (for single SiC layer etch stop layer);

12. Improved film quality for SiC layer and/or SiOC layer;

13. Improved performance in EM and SM tests for SiOC layer;

14. Providing a non-He method of forming SiOC layer; and

15. Improving reliability of a device incorporating an improved SiOC layer and/or SiC layer in accordance with the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the processes, materials, and steps described in the specification. As one of ordinary skill in the art will readily appreciate from the disclosure of the present invention, processes, materials, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:

forming an SiC layer in a reaction chamber, wherein the forming an SiC layer is performed at least in part by flowing only substantially pure trimetholsilane (3MS) into and through the reaction chamber, forming a SiOC etch stop layer on the SiC layer in the reaction chamber with an SiOC formation process comprising:

flowing trimetholsilane (3MS) into and through the reaction chamber, flowing $CO_2$ into and through the reaction chamber, such that the ratio of the flow rate of $CO_2$ to the flow rate of 3MS is about 3.5 to 1, pressurizing the reaction chamber at a pressure less than about 2 torr, and energizing the reaction chamber with low frequency RF power of at least about 100 watts; and forming a dielectric layer over the SiOC layer.

2. The method of claim 1, wherein the SiC layer is formed in the reaction chamber using an SiC formation process comprising pressurizing the reaction chamber at a pressure less than about 2 torr.

3. The method of claim 1, wherein the SiOC formation process is a non-He process.

4. The method of claim 1, wherein a flow rate of the 3MS flowing to form the SiOC etch stop layer is about 100 sccm.

5. The method of claim 1, wherein a flow rate of the $CO_2$ flowing is about 350 sccm.

6. The method of claim 1, wherein the SiOC formation process further comprises:
   heating the reaction chamber to a temperature of about 350° C.; and
   energizing the reaction chamber with high frequency RE power of about 400 watts.

7. A method of manufacturing a semiconductor device, comprising:
   forming a SiOC etch stop layer over an underlying layer in a reaction chamber with an SiOC formation process comprising:
   flowing trimetholsilane (3MS) into and through the reaction chamber,
   flowing $CO_2$ into and through the reaction chamber,
   pressurizing the reaction chamber at a pressure less than about 2 torr, and
   energizing the reaction chamber with low frequency RF power of at least about 100 watts;
   wherein the underlying layer is formed at least in part through a process using solely substantially pure trimetholsilane; and
   forming a dielectric layer over the SiOC layer.

8. The method of claim 7, wherein the SiOC formation process is a non-He process.

9. The method of claim 7, wherein the underlying layer is an SiC layer.

10. The method of claim 7, wherein a flow rate of the 3MS flowing to form the SiOC etch stop layer is about 100 sccm.

11. The method of claim 7, wherein a flow rate of the $CO_2$ flowing is about 350 sccm.

12. The method of claim 7, wherein the SiOC formation process further comprises:
   heating the reaction chamber to a temperature of about 350° C.; and
   energizing the reaction chamber with high frequency RF power of at about 400 watts.

13. The method of claim 7, wherein the SiOC layer is capable of passing an electron migration test having conditions of about 300°0 C. with a J stress of about $2 \times 10^6$ A/cm2 and capable of passing a stress migration test having conditions of about 175° C. for about 500 hours.

* * * * *

UNITED STATES PATENT AND TRADEMARK OFFICE
CERTIFICATE OF CORRECTION

| | |
|---|---|
| PATENT NO. | : 7,375,040 B2 |
| APPLICATION NO. | : 11/325935 |
| DATED | : May 20, 2008 |
| INVENTOR(S) | : Lin et al. |

It is certified that error appears in the above-identified patent and that said Letters Patent is hereby corrected as shown below:

On the Title Page, Section (56) References Cited, U.S. PATENT DOCUMENTS, 15th entry, delete "Weldman" and insert --Weidman--.
In Col. 3, line 48, after "the" insert --present--.
In Col. 11, line 15, delete "RE" and insert --RF--.
In Col. 12, line 24, delete "300°0" and insert --300°--.

Signed and Sealed this

Twenty-ninth Day of July, 2008

JON W. DUDAS
*Director of the United States Patent and Trademark Office*